US008603905B2

(12) United States Patent
Blatchford

(10) Patent No.: US 8,603,905 B2
(45) Date of Patent: Dec. 10, 2013

(54) DUAL ALIGNMENT STRATEGY FOR OPTIMIZING CONTACT LAYER ALIGNMENT

(75) Inventor: James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 360 days.

(21) Appl. No.: 12/635,906

(22) Filed: Dec. 11, 2009

(65) Prior Publication Data

US 2010/0167513 A1       Jul. 1, 2010

Related U.S. Application Data

(60) Provisional application No. 61/141,571, filed on Dec. 30, 2008.

(51) Int. Cl.
*H01L 21/3205*       (2006.01)
(52) U.S. Cl.
USPC ............... 438/586; 257/E21.575; 356/399
(58) Field of Classification Search
USPC ............... 438/586; 257/E21.575; 356/399
See application file for complete search history.

(56) References Cited

U.S. PATENT DOCUMENTS

| 6,596,466 | B1 * | 7/2003 | Pohland et al. | 430/313 |
| 2007/0241411 | A1 * | 10/2007 | Yang et al. | 257/383 |
| 2010/0070942 | A1 * | 3/2010 | Madurawe | 716/16 |

\* cited by examiner

*Primary Examiner* — Eugene Lee
*Assistant Examiner* — Elias M Ullah
(74) *Attorney, Agent, or Firm* — Jacqueline J. Garner; Wade J. Brady, III; Frederick J. Telecky, Jr.

(57) ABSTRACT

An improved method for optimizing layer registration during lithography in the fabrication of a semiconductor device is disclosed. In one example, the method comprises optimizing contact layer registration of an SRAM device having a plurality of transistors having active and gate region features extending generally along a channel length (X) direction and a channel width (Y) direction, respectively. The method comprises aligning a contact layer to a gate layer in the channel length direction (X), using gate layer overlay marks to control the alignment of the contact layer in the channel length direction (X) of the semiconductor device. The method further includes aligning the contact layer to an active layer in the channel width direction (Y), using active layer overlay marks to control the alignment of the contact layer in the channel width direction (Y) of the semiconductor device.

19 Claims, 9 Drawing Sheets

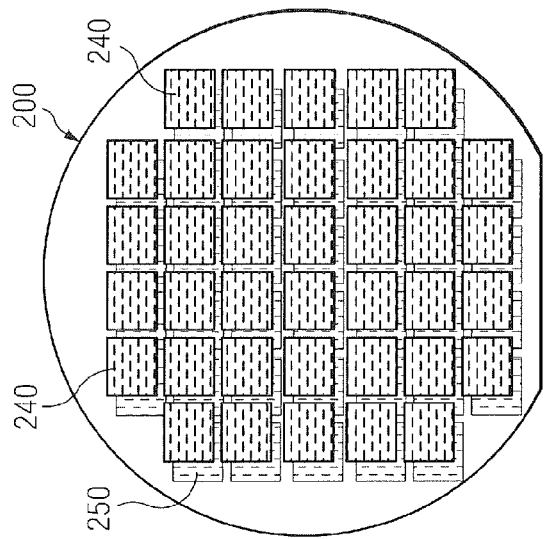
FIG. 2A MARKSHIFT (X,Y)
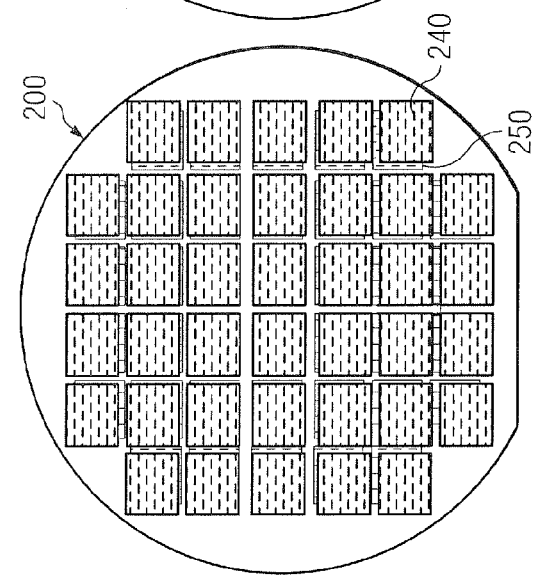
FIG. 2B SCALING (X,Y)
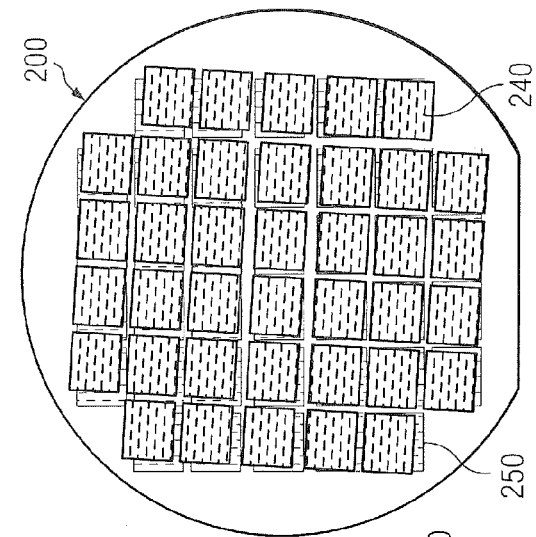
FIG. 2C WAFER ROTATION ORTHO
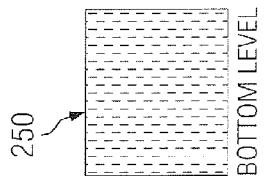
FIG. 2D TOP LEVEL
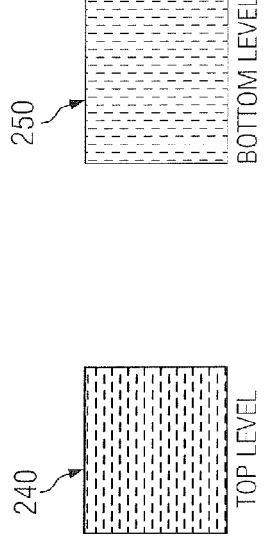
FIG. 2E BOTTOM LEVEL

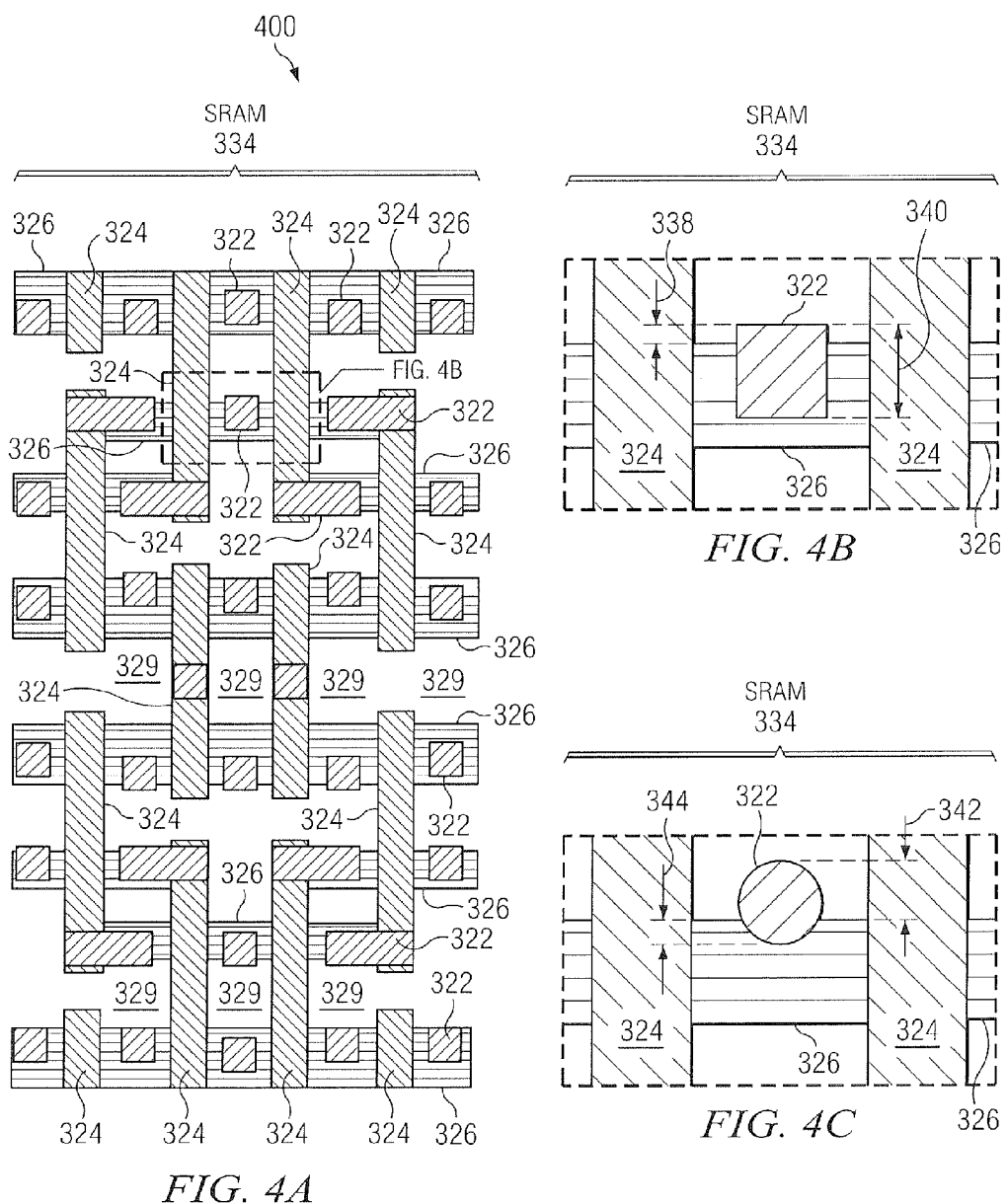

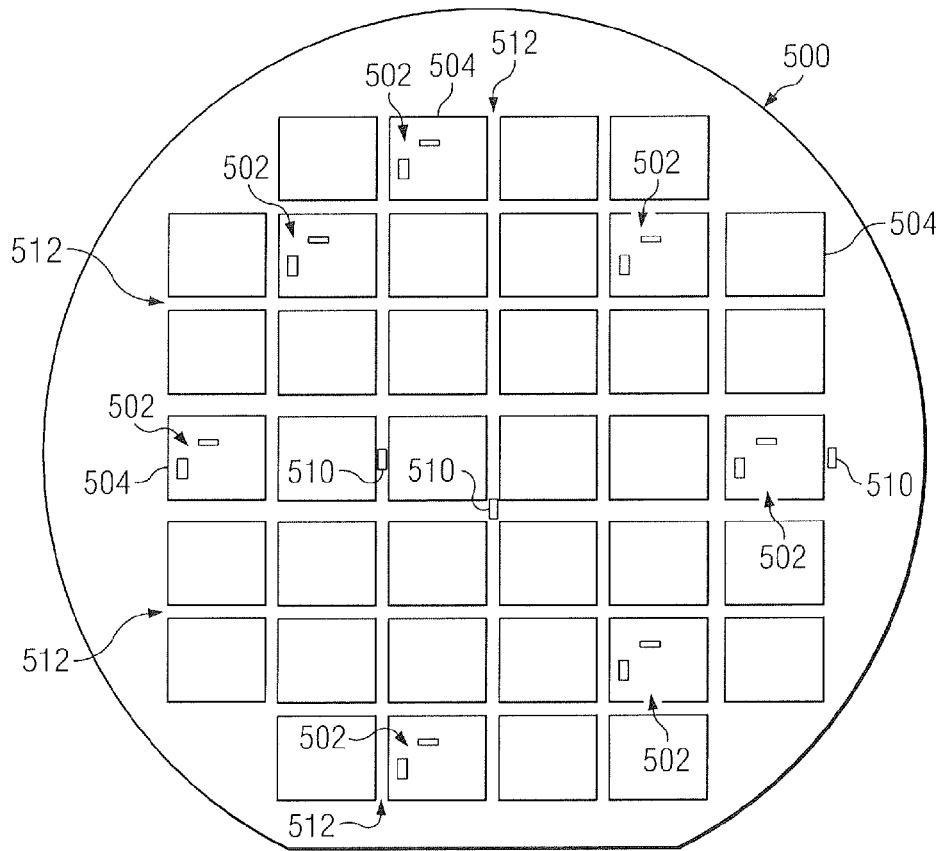
FIG. 5A
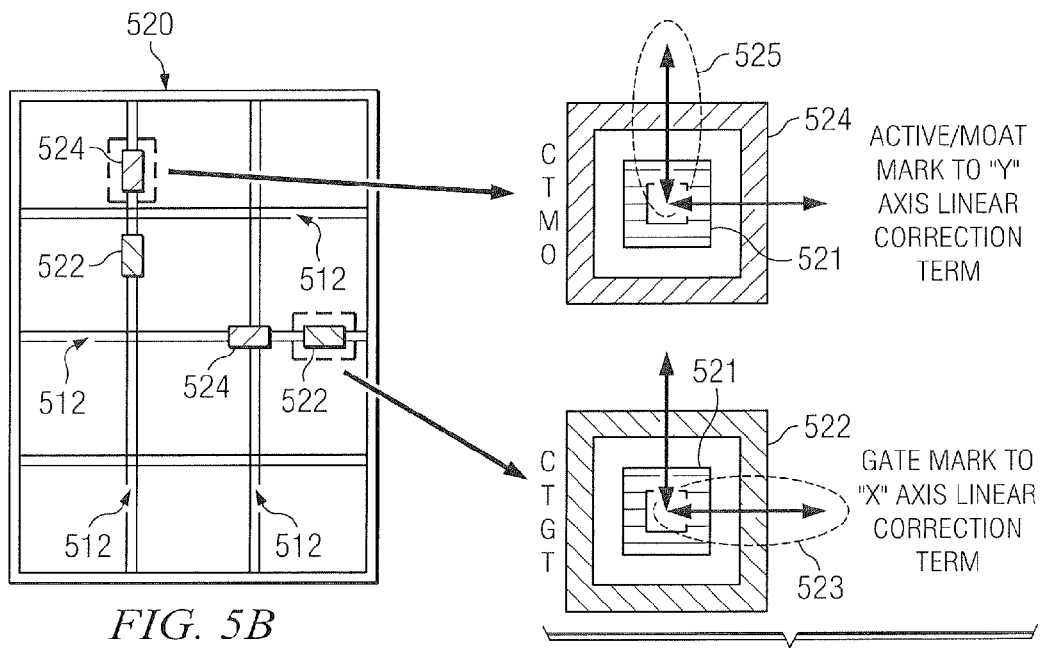
FIG. 5B
FIG. 5C

DUAL ALIGNMENT STRATEGY FOR OPTIMIZING CONTACT LAYER ALIGNMENT

FIELD OF INVENTION

The present invention relates generally to semiconductor devices and more particularly to static random access memory (SRAM) devices and innovative methods of optimizing the alignment of the contact layer during device fabrication lithography.

BACKGROUND OF THE INVENTION

It can be appreciated that several trends presently exist in the electronics industry. Devices are continually getting smaller, faster and requiring less power, while simultaneously being able to support and perform a greater number of increasingly complex and sophisticated functions. One reason for these trends is an ever increasing demand for small, portable and multifunctional electronic devices such as cellular phones, personal computing devices, and personal sound systems are devices which are in great demand in the consumer market.

Accordingly, there is a continuing trend in the semiconductor industry to manufacture integrated circuits (ICs) with higher device densities by scaling down dimensions (e.g., at submicron levels) on semiconductor wafers. To accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yield in IC fabrication processes by providing or 'packing' more circuits on a semiconductor die and/or more die per semiconductor wafer, for example.

As these feature sizes and separations between the features become smaller, alignments between such features also become more demanding.

Contact alignment is critical for static random access memory (SRAM) device yield. By way of example, contact (CONT) to GATE misalignment may result in shorts, leading to single-bit fails (SBFs). CONT to ACTIVE (or MOAT) misalignment can lead to very high resistance and junction leakage, which also leads to SBFs or IDDQ (Quiescent drain current) issues. One conventional strategy to alleviate these problems has been to align the CONT layer to the GATE. However, this solution results in poor alignment with respect to the ACTIVE layer as the CONT to ACTIVE alignment will then become the RMS error of the CONT-GATE and the GATE-ACTIVE in this strategy. As a result, yield may suffer with CONT-ACTIVE misalignment, or alternately, the SRAM bitcell may need to be enlarged to provide additional margin against misalignment.

Consequently, for advanced scaling nodes such as 45 nm and beyond, it would be desirable to be able to provide improved alignment capabilities in the fabrication of SRAM devices and other such semiconductor devices.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to an improved method for optimizing layer registration during lithography in the fabrication of a semiconductor device. In one embodiment, a method is disclosed for optimizing contact layer registration during lithography in the fabrication of a semiconductor device, the device having a plurality of transistors having active and gate region features extending generally along a channel length (X) direction and a channel width (Y) direction, respectively. The method comprises aligning a contact layer to a gate layer in the channel length direction (X) of the semiconductor device, and aligning the contact layer to an active layer in the channel width direction (Y) of the semiconductor device.

For advanced technology nodes (e.g., 45 nm CMOS logic), fiducial marks or fiducials distributed in the scribe street may be used to achieve and measure registration of two mask layers in a semiconductor device. For a given mask layer, the term 'alignment marks' refers herein to fiducials that have been placed on the wafer at a previous masking layer. These fiducials are generally etched into the wafer substrate, are specific to the lithographic exposure tool used in the manufacturing process, and are measured by the exposure tool to determine the position of the wafer on the exposure tool's wafer stage. The term 'overlay marks' refers herein to fiducials that are used to measure registration of mask layer A with respect to mask layer B after mask layer B has been exposed (e.g., 'box-in-box' structures). These fiducials may be measured by a tool specifically designed for registration measurements, separate from the exposure tool. In the subsequent discussions, in the most general sense, the term 'aligning layer B to layer A' refers to measuring the overlay marks associated with layers A and B, then adjusting the exposure tool so as to remove or minimize systemic registration errors between the two mask layers. It is noted that the choice of alignment marks used to accomplish the alignment of layer B to layer A is somewhat arbitrary. In some cases, the alignment marks associated with mask A are used by the exposure tool to characterize the incoming wafer position; however, any pre-existing alignment mark can be used for this purpose.

In another embodiment, aligning the contact layer to the gate layer in the channel length direction (X) of the semiconductor device, comprises using gate layer overlay marks associated with the gate layer to control the alignment of the contact layer in the channel length direction (X), and the aligning the contact layer to the active layer in the channel width direction (Y) of the semiconductor device, comprises using active layer overlay marks associated with the active layer to control the alignment of the contact layer in the channel width direction (Y) of the device.

In still another embodiment, a method is disclosed for optimizing overlay layer registration during lithography in the fabrication of an SRAM semiconductor device, the device having a plurality of transistor features extending generally along a first direction and a second direction, the method comprising aligning an overlay layer to a first layer in the first direction of the SRAM semiconductor device, using first layer overlay marks to control the alignment of the overlay layer in the first direction. The method further includes aligning the overlay layer to a second layer in the second direction of the SRAM semiconductor device, using second layer overlay marks to control the alignment of the overlay layer in the second direction.

In another embodiment, a method is disclosed for optimizing overlay layer registration during lithography in the fabrication of an SRAM semiconductor device, the device having a plurality of transistor features extending generally along a first direction and a second direction, the method comprising aligning an overlay layer to a first layer in the first direction of the SRAM semiconductor device, using first layer alignment and overlay marks to control the alignment of the overlay layer in the first direction. The method further includes aligning the overlay layer to a second layer in the second direction of the SRAM semiconductor device, using second layer alignment and overlay marks to control the alignment of the overlay layer in the second direction.

In yet another embodiment, a method is disclosed for optimizing contact layer registration during lithography utilizing a scanner in the fabrication of a semiconductor device, the device having a plurality of transistors having active and gate region features extending generally along a channel length (X) direction and a channel width (Y) direction, respectively, the method comprising aligning contact layer overlay marks associated with a contact layer to gate layer overlay marks associated with a gate layer to identify channel length direction (X) linear components, and aligning contact layer overlay marks associated with the contact layer to active layer overlay marks associated with the active layer to identify channel width direction (Y) linear components. The method further includes using the channel length direction (X) linear components of the gate layer overlay marks to control a lens of the scanner for the correction and alignment of the contact layer in the channel length direction (X) of the semiconductor device, and using the channel width direction (Y) linear components of the active layer overlay marks to control a stage of the scanner for the correction and alignment of the contact layer in the channel width direction (Y) of the semiconductor device.

In another embodiment, a method is disclosed for optimizing contact layer registration during lithography utilizing a scanner in the fabrication of a semiconductor device, the device having a plurality of transistors having active and gate region features extending generally along a channel length (X) direction and a channel width (Y) direction, respectively, the method comprising scanning alignment marks associated with a gate layer and aligning contact layer overlay marks associated with a contact layer to gate layer overlay marks associated with a gate layer to identify channel length direction (X) linear components, and scanning alignment marks associated with an active layer and aligning contact layer overlay marks associated with the contact layer to active layer overlay marks associated with the active layer to identify channel width direction (Y) linear components. The method further includes using the channel length direction (X) linear components of the gate layer overlay marks to control a lens of the scanner for the correction and alignment of the contact layer in the channel length direction (X) of the semiconductor device, and using the channel width direction (Y) linear components of the active layer overlay marks to control a stage of the scanner for the correction and alignment of the contact layer in the channel width direction (Y) of the semiconductor device.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIGS. 2A-2E are simplified diagrams of an exemplary semiconductor wafer illustrating several typical misalignment issues that must be corrected during wafer fabrication lithography.

FIGS. 4A-4E are partial top plan views of both the SRAM/core and logic regions of a conventional SRAM mask pattern, including enlarged sections as viewed at the mask level and as viewed after manufacturing, the views illustrating the worse-case misalignment problems encountered in the conventional formation of an exemplary SRAM semiconductor device.

FIGS. 5A-5C are simplified diagrams of an exemplary semiconductor wafer illustrating placements of alignment marks within several die and typical placements of overlay markers within the scribe streets of FIG. 5B, the alignment and overlay marks used for correction of misalignments during wafer fabrication lithography, wherein GATE layer alignment and overlay marks are used to control the X direction of the CONT overlay, and ACTVE/MOAT layer alignment and overlay marks are used to control the Y direction of the CONT overlay.

DETAILED DESCRIPTION OF THE INVENTION

Figure 1:
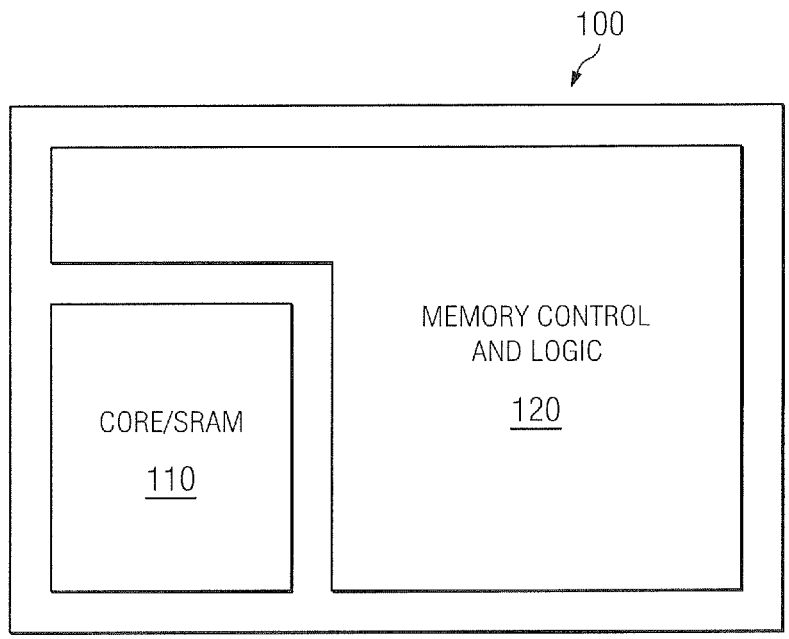
FIG. 1 is a block diagram of an exemplary semiconductor device that incorporates SRAM memory circuitry such as may be used in accordance with one or more aspects, the device having core and logic regions.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced; subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Referring now to FIG. 1, an exemplary semiconductor device 100 that incorporates SRAM memory circuitry is illustrated such as may be used in accordance with one or more aspects. The SRAM memory containing device 100 comprises, for example, a semiconductor integrated circuit chip or die having a core region 110 and a logic region 120. The core region 110 comprises an array of SRAM memory cells, such as an array of 6T SRAM memory cells, for example. The logic region 120 comprises various memory control and logic functions associated with accessing, reading, and writing operations of the SRAM memory array 110 as well as general logic for other operations and function of the semiconductor device.

FIGS. 2A-2E illustrate simplified diagrams of an exemplary semiconductor wafer 200 illustrating several typical misalignment issues that are usually corrected during wafer fabrication lithography. As semiconductor features become significantly smaller, it becomes increasingly critical that the masks used during lithography and the layers produced therefrom, are more precisely aligned with respect to each other minimizing misalignments.

For example, wafer 200 of FIG. 2A illustrates an X and Y direction markshift misalignment between an upper layer mask 240 at a top level (enlarged in FIG. 2D), and a lower layer mask 250 at a bottom level (enlarged in FIG. 2E) of the wafer 200, wherein the upper layer mask 240 is shifted in an X and/or a Y direction relative to the underlying lower layer mask 250. Wafer 200 of FIG. 2B illustrates a scaling misalignment in the X and Y plane between the upper layer mask 240 at the top level, and the lower layer mask 250 at the bottom level of the wafer 200. In the illustrated scaling misalignment error of FIG. 2B, the upper layer mask 240 is, for example, larger than the underlying lower layer mask 250. Wafer 200 of FIG. 2C illustrates a wafer rotation or orthogonal misalignment between the upper layer mask 240 at the top level, and the lower layer mask 250 at the bottom level of the wafer 200. In the illustrated wafer rotation or orthogonal misalignment of FIG. 2C, the upper layer mask 240 is, for example, misaligned rotationally (e.g., clockwise) relative to the underlying lower layer mask 250.

Figure 3A:
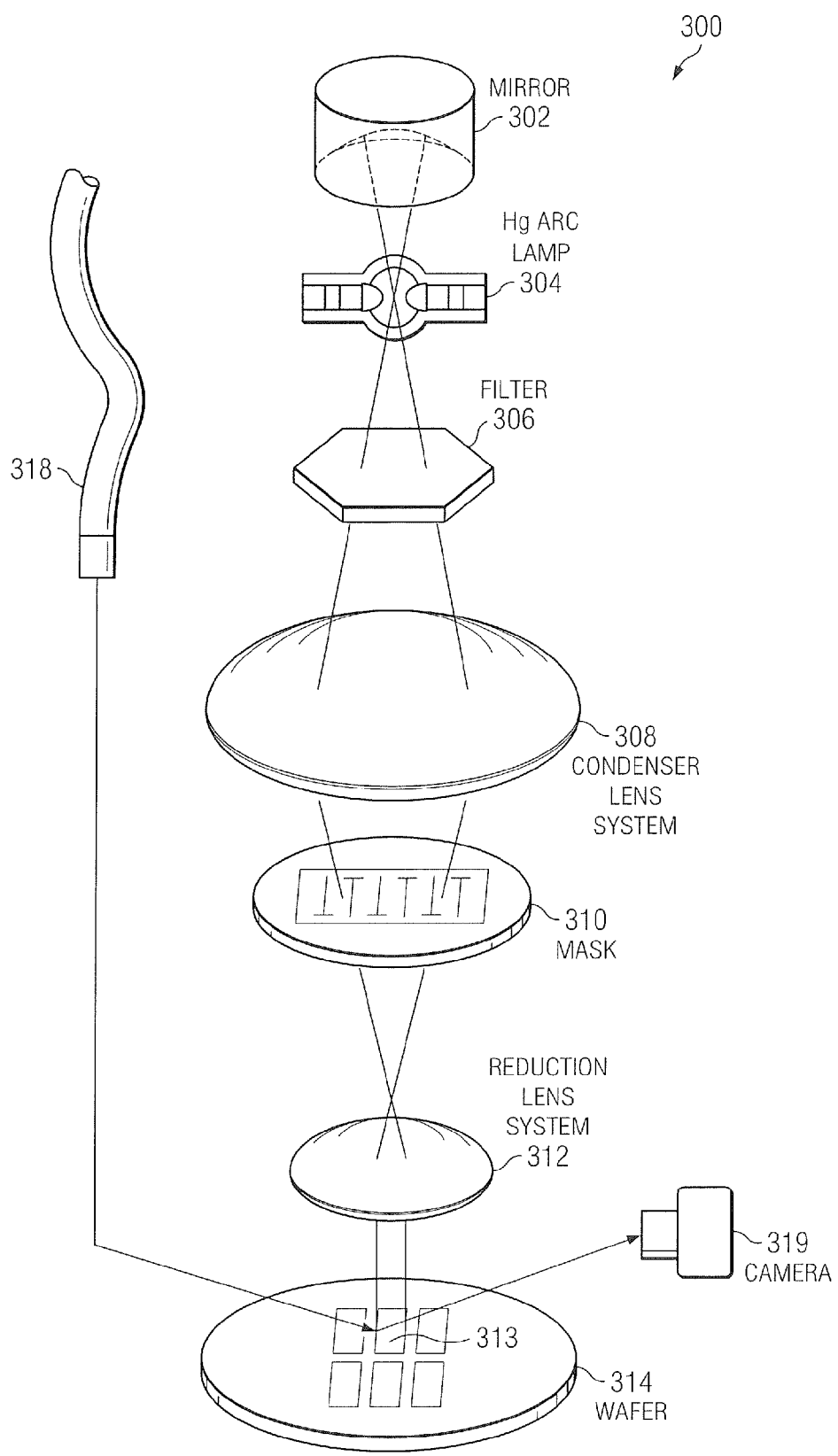
FIG. 3A is a simplified diagram illustrating a lithographic scanner, such as may be used during semiconductor wafer fabrication lithography and to correct the misalignment issues of FIGS. 2A-2E, in accordance with one or more embodiments.

FIG. 3A illustrates a simplified diagram of an exemplary lithographic scanner 300, such as may be used during semiconductor wafer lithography and fabrication. The scanner 300, for example, may be used to correct the misalignment issues illustrated in FIGS. 2A-2E, and other such misalignments in accordance with one or more embodiments.

Scanner 300 of FIG. 3A comprises a mirror 302 which collects and focuses the light from a mercury arc lamp 304 through a filter 306 to a condenser lens system 308. The condenser lens system 308 then refocuses and projects the collected light through a mask 310 and a reduction lens system 312, which recollimates the light that passes through the mask 310 onto an exposure field 313 of target wafer 314. Light from a fiber optic light source 318 may also be used to illuminate the wafer 314 or the exposure field 313 for a camera 319 that may include a CCD detector to generate contrast scans of search (course) marks and fine alignment marks, which are also known as overlay and alignment marks, respectively (See, e.g., overlay 510 and alignment 502 marks of FIG. 5A, described further hereafter) on the wafer 314. In accordance with one or more aspects and methods of the present embodiments, it is appreciated that various components of the above identified scanner can be moved or adjusted to make corrections to the alignments between the several masks used during lithography.

Figure 3B:
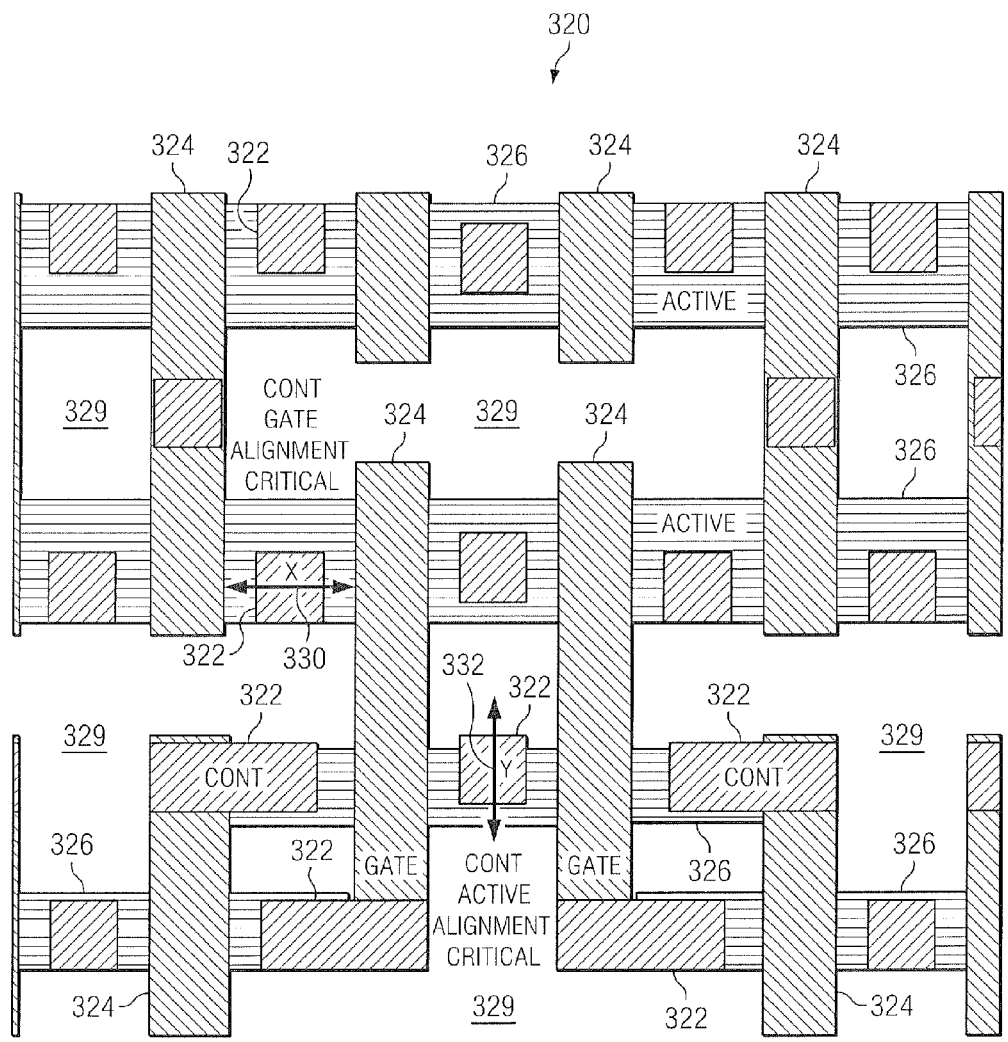
FIG. 3B is a partial top plan view of a conventional SRAM cell pattern illustrating critical alignment areas between the contact (CONT) and GATE in the channel length direction or (X) direction, and between the CONT and ACTIVE (moat) layers in the channel width direction or (Y) direction.

In particular, FIG. 3B illustrates a partial top plan view of a conventional industry standard SRAM cell pattern 320. SRAM cell pattern 320 illustrates critical alignment areas between the contact (CONT) overlay layer/mask 322 and GATE overlay layer/mask 324 in the channel length direction or (X) direction 330, and between the CONT overlay layer 322 and the ACTIVE (moat) layer/mask 326 in the channel width direction or (Y) direction 332. In other words, from the SRAM cell pattern 320 of FIG. 3B, it can be appreciated that the CONT 322 to GATE 324 alignment is most critical in the channel length direction or (X) direction 330, while the CONT 322 to ACTIVE 326 alignment is most critical in the channel width direction or (Y) direction 332. The cell of FIG. 3B further includes isolation regions 329 that act to separate and electrically isolate the ACTIVE (moat) layer/mask regions 326.

Thus, in one embodiment, and for advanced nodes (e.g., 45 nm and beyond), we can restrict gate orientation to the Y direction (vertical direction in FIG. 3B) for the minimum-L (channel length) features. That is, in one embodiment, when contact CONT 322 lithography is performed, the GATE alignment (fine) and overlay (course) marks can be used to control the X-direction 330 alignment of the CONT overlay 322, and the ACTIVE alignment and overlay marks can be used to control the Y-direction 332 alignment of the CONT overlay 322.

To accomplish these alignment control corrections, in one embodiment, one or more of the lens systems 308 or 312 of scanner 300 may be used to control the channel length direction (X) direction 330 of the CONT overlay 322, and one or more of the wafer 314 or mask 310 stages may be used to control the channel width direction (Y) direction 332 of the CONT overlay 322.

Although the contact (CONT) overlay layer/mask 322, may be used to describe an overlay layer or mask 322, the CONT layer 322 may also be used herein to represent the locations where conductive contacts 322 will subsequently be formed. For example, conductive contacts 322 are typically formed through a photoresist layer which is patterned according to the aligned CONT layer/mask 322, and within an interlevel dielectric layer (ILD) (not shown) down to the underlying GATE 324 and ACTIVE 326 layers/regions.

It will also be appreciated that the channel length and channel width direction, or the X and Y direction assignments may be reversed in another embodiment. In yet another embodiment, the channel length and channel width direction, or the X and Y direction assignments may be orthogonal with respect to each other or they may be non-orthogonal with respect to each other.

Figure 4D:
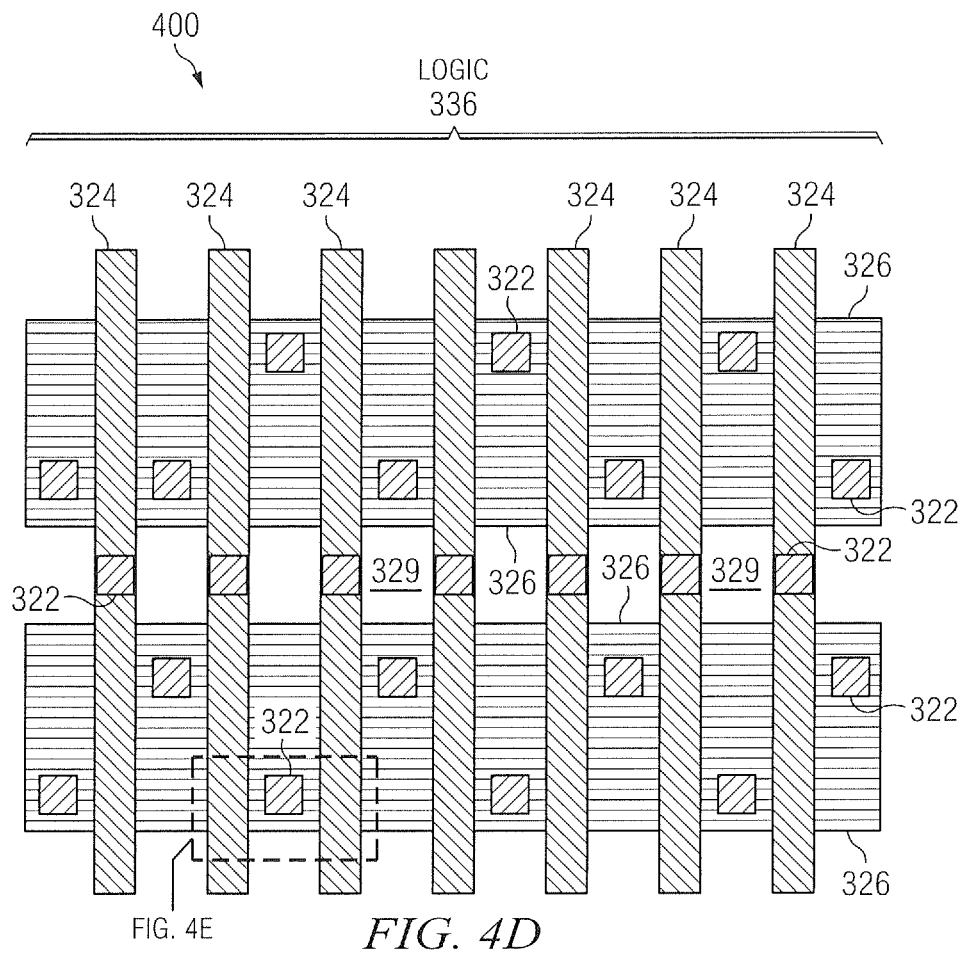
Figure 4E:
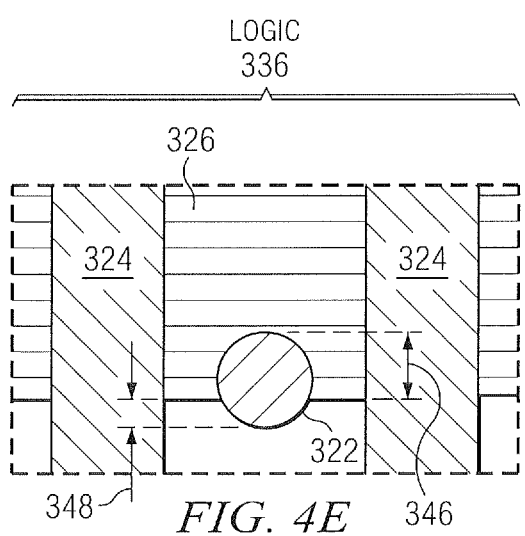

FIGS. 4A-4E illustrate partial top plan views and enlarged sections of both the SRAM/core 334 and logic 336 regions of a conventional SRAM mask pattern as viewed at the mask level (as drawn) in FIG. 4B and as viewed after manufacturing in FIGS. 4C and 4E, which illustrate the worse-case misalignment problems encountered during conventional lithography and formation of an exemplary SRAM semiconductor device 400.

Similar to the SRAM cell pattern 320 of FIG. 3B, the exemplary SRAM semiconductor device 400 of FIG. 4B comprises in both the SRAM/core 334 and logic 336 regions; the contact (CONT) overlay mask 322, the GATE overlay mask 324, and the ACTIVE (moat) mask 326 regions that are separated by isolation regions 329 such as a shallow trench isolation structure (STI) 329 or another such oxide isolation structure including a FOX 329.

The semiconductor device (e.g., a memory cell of the SRAM) may comprise a plurality of transistors having gate and active region features generally aligned along channel length (e.g., X) and channel width (e.g., Y) directions. For example, in FIGS. 3B and 4A-E the GATE regions 324 have the channel length dimension generally aligned along, for example, an X-direction, and the channel width dimension of the gate regions 324 generally aligned along, for example, a Y-direction. Similarly, the contacts CONT 322, ACTIVE/MOAT regions 326 and isolation regions 329 are generally aligned along either the channel length direction (e.g., X-direction or axis) 330, or in the channel width direction (e.g., Y-direction or axis) 332.

For example, FIG. 4B illustrates a region near a contact 322 in the SRAM 334 at the mask level (as drawn), wherein the CONT overlay mask 322 originally has a Y direction or height dimension 340 of 40 nm and an offset dimension 338 in the Y direction of about 9 nm, thereby overlapping the ACTIVE mask 326 by 31 nm. After lithography and fabrication, the same region near the contact 322, as shown in FIG. 4C, illustrates that the contact 322 has diffused from a square to a generally round shape, and has shrunk to a Y direction height dimension of about 36 nm comprising an offset dimension 342 in the Y direction of about 25 nm and an overlap dimension 344 onto the ACTIVE mask 326 of about 11 nm. Since the contact 322 has shrunk from 40 nm to 36 nm, the offset dimension 342 of FIG. 4C should have shrunk from 9 nm to about 7 nm, thus, this change in the Y-direction dimension constitutes, for example, a worse case misalignment of:

Misalignment=25 nm−7 nm=18 nm.

Similarly, FIG. 4D illustrates a region near a contact 322 in the logic region 336 at the mask level (as drawn), wherein the CONT 322 originally fully overlaps the ACTIVE 326. After lithography and fabrication, the same region near the contact 322, as shown in FIG. 4E, illustrates that the contact 322 of the logic region 336 has also diffused from a square to a generally round shape, and has shrunk to a Y direction height dimension of about 36 nm comprising an offset dimension 348 in the Y direction of about 11 nm and an overlap dimension 346 (overlapping onto the ACTIVE mask 326) of about 25 nm. Thus, this change in the Y-direction dimension, for example, again constitutes a worse case misalignment of:

Misalignment=25 nm−7 nm=18 nm.

In accordance with one embodiment, to correct these misalignments, GATE alignment and overlay marks on the semiconductor wafer are used to control the X-direction of the CONT overlay, and ACTVE/MOAT alignment and overlay marks are used to control the Y-direction of the CONT overlay.

FIGS. 5A-5C, for example, illustrate an exemplary semiconductor wafer 500 illustrating typical placements of alignment marks 502 within several die 504 of the wafer 500 and typical placements of overlay markers 510 within the scribe streets 512. FIG. 5B further illustrates a scanner image 520 of these alignment marks 502 and overlay marks 510 within the scribe streets 512 running in both the horizontal, channel length direction (e.g., X-direction or axis) 330, or in the vertical, channel width direction (e.g., Y-direction or axis) 332, such as may be used for correction of misalignments during wafer fabrication lithography. In accordance with one or more embodiments, the horizontal, channel length direction (e.g., X-direction or axis) 330, may be interchanged for the vertical, channel width direction (e.g., Y-direction or axis) 332.

FIGS. 5B and 5C further illustrate one embodiment of a method of alignment or registration of a CONT overlay 521 to a GATE mark 522 in the X-direction, and to an ACTVE/MOAT mark 524 in the Y-direction. Alternately, the GATE mark 522 may comprise one or more marks such as a GATE alignment and overlay mark, and the ACTVE/MOAT mark 524 may comprise one or more marks such as an ACTIVE/MOAT alignment and overlay mark such as the alignment marks 502 and overlay marks 510 described above in FIG. 5A.

In one embodiment, the CONT overlay mark 521 is positioned to align with a GATE mark 522, and the magnitude of the required X-direction correction is used to obtain an X-direction linear correction term 523. In addition, the CONT overlay mark 521 is positioned to align with an ACTIVE/MOAT mark 524, and the magnitude of the required Y-direction correction is used to obtain a Y-direction linear correction term 525. In this way, the GATE mark 522 or GATE alignment and overlay marks (502 & 510) may be used to control the X-direction of the CONT overlay, and the ACTIVE/MOAT mark 524 or ACTVE/MOAT alignment and overlay marks (502 & 510) may be used to control the Y-direction of the CONT overlay.

Figure 6A:
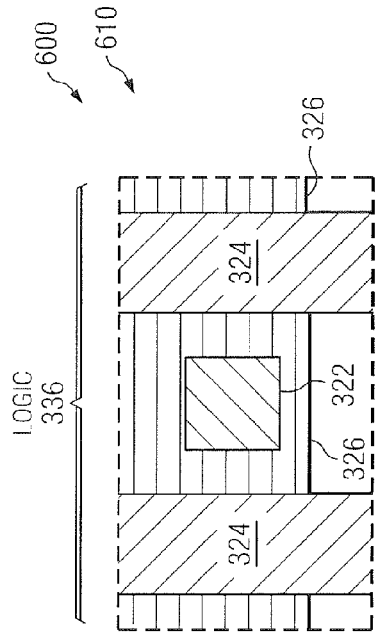
FIGS. 6A-6D are partial top plan view enlarged sections of both the SRAM/core and logic regions of a conventional SRAM mask pattern, similar to that of FIGS. 4B, 4C and 4E, as viewed at the mask level and as viewed after manufacturing, the views illustrating the worse-case misalignments encountered when the dual-alignment method of the present invention is utilized to correct the misalignments during lithography and formation of an exemplary SRAM semiconductor device, according to one or more aspects.
Figure 6B:
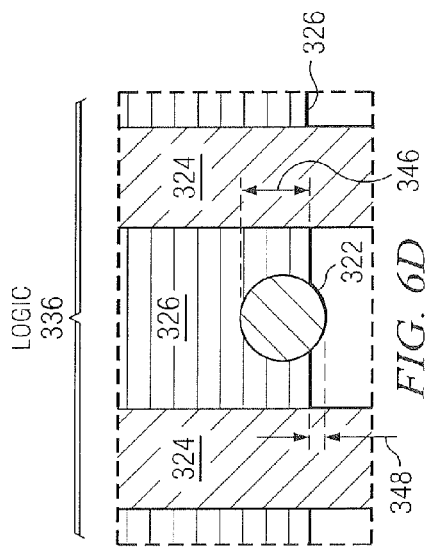
Figure 6C:
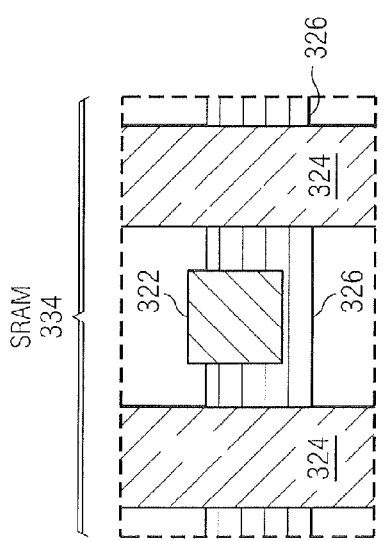
Figure 6D:
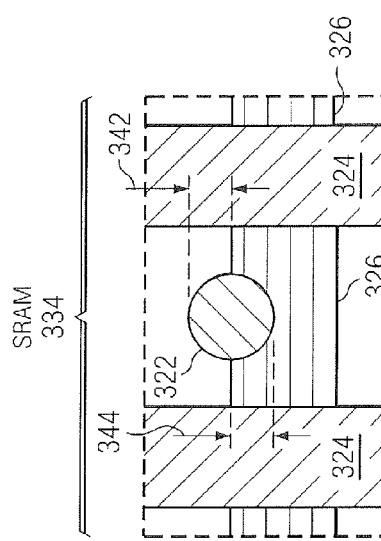

FIGS. 6A-6D illustrate partial top plan views of both the SRAM/core 334 and logic regions 336 of a semiconductor device 600, having an SRAM mask pattern 610, as viewed at the mask level (as drawn) in FIGS. 6A and 6C, and as viewed after manufacturing in FIGS. 6B and 6D. FIGS. 6B and 6D further illustrate the worse-case misalignments encountered when one or more embodiments of the dual-alignment method is utilized to correct the misalignments during lithography and formation of an exemplary semiconductor device such as SRAM device 100 of FIG. 1, and SRAM device 600 of FIGS. 6A-6D.

For example, after lithography and fabrication utilizing the dual-alignment method, the region near the contact 322, as shown in FIG. 6B, illustrates that although the contact 322 has again shrunk to a Y-direction height dimension of about 36 nm, the offset dimension 342 in the Y direction has decreased to about 17 nm and the overlap dimension 344 has increased to about 19 nm. Thus, this change in the Y-direction dimension now constitutes, for example, a worse case misalignment of:

Misalignment=17 nm−7 nm=10 nm, (which is an 8 nm improvement).

Similarly, after lithography and fabrication utilizing the dual-alignment method, the region near the contact 322 in the logic region 336, as shown in FIG. 6D, illustrates that the offset dimension 348 in the Y direction has decreased to about 3 nm and the overlap dimension 346 has increased to about 33 nm. Thus, this change in the Y-direction dimension also now constitutes, for example, a worse case misalignment of:

Misalignment=17 nm−7 nm=10 nm, (which is an 8 nm improvement).

Figure 8:
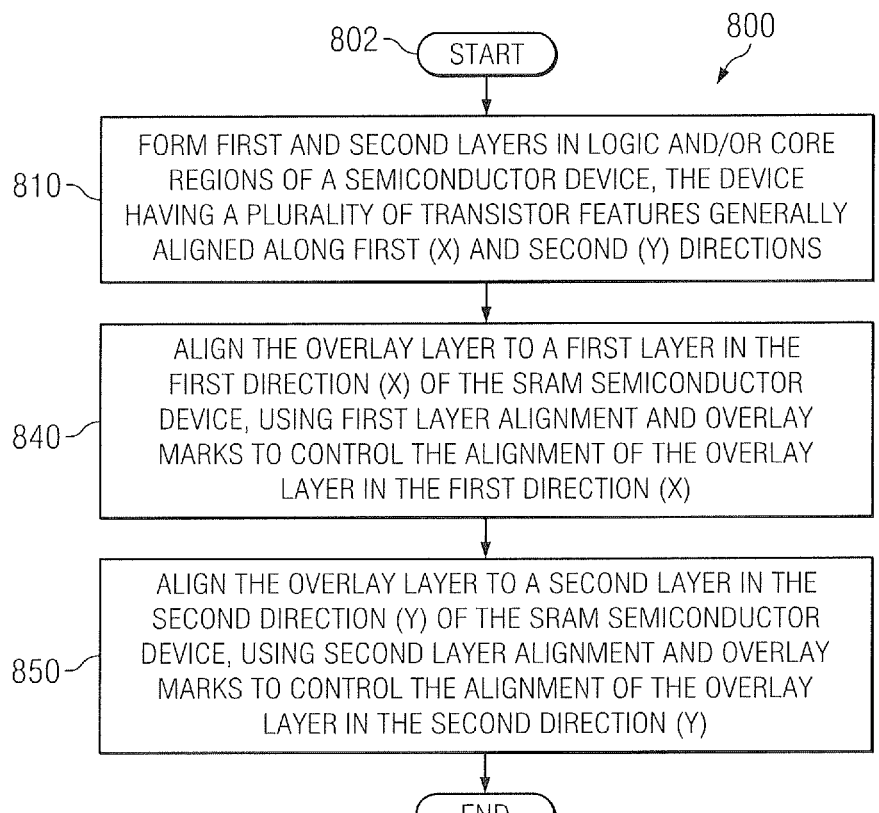
FIGS. 7 and 8 are flow diagrams illustrating exemplary methodologies for optimizing layer registration in an SRAM or another such semiconductor device during lithography in accordance with one or more aspects.
Figure 7:
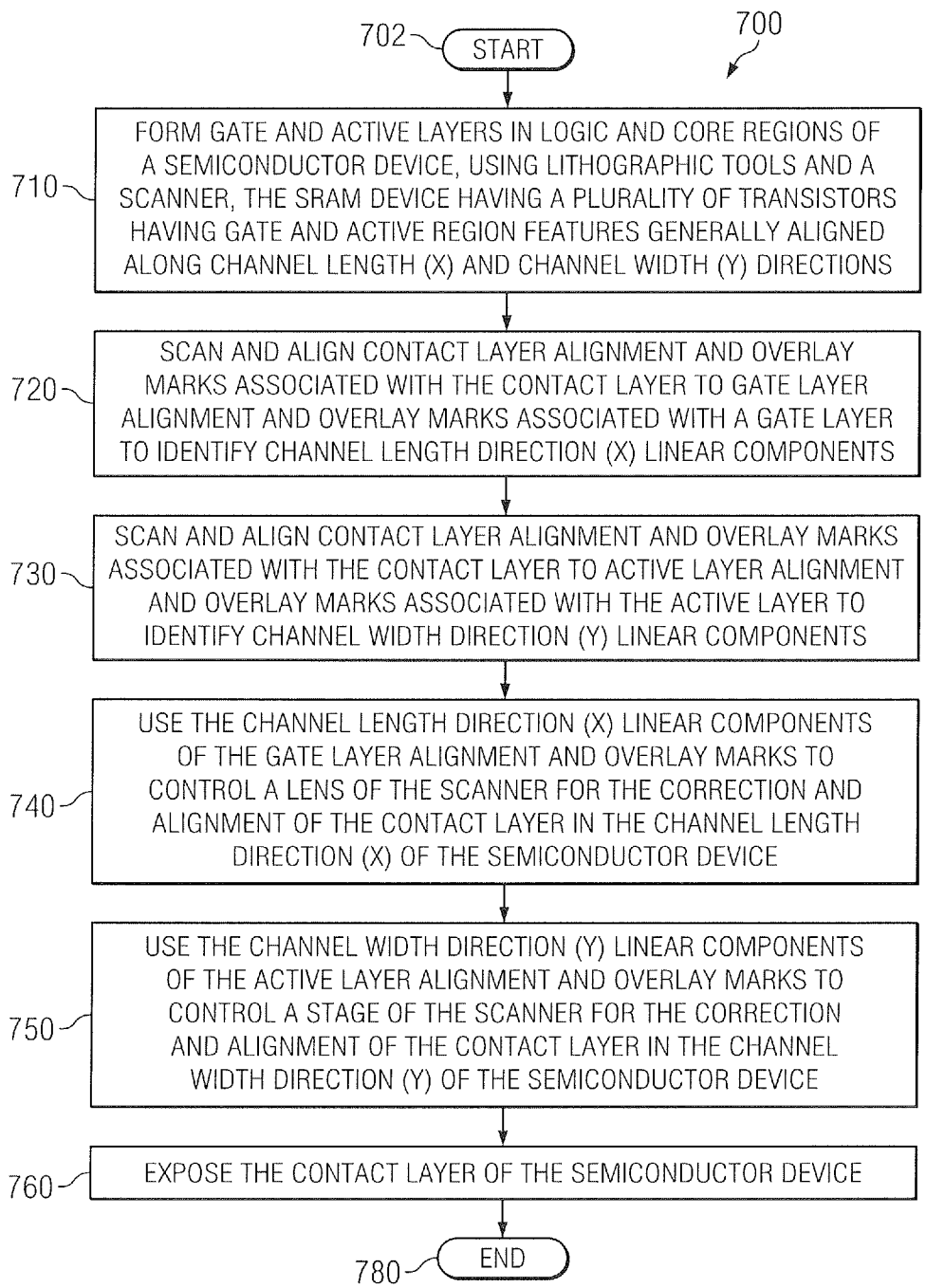

FIGS. 7 and 8 illustrate flow diagrams 700 and 800, respectively, of exemplary methodologies for optimizing mask/layer registration during lithography of an exemplary semiconductor device such as SRAM device 100 of FIG. 1, and SRAM device 600 of FIGS. 6A-6D in accordance with one or more embodiments.

In FIG. 7, an exemplary methodology 700 is illustrated for optimizing contact layer registration (or another such mask/layer) during lithography of a semiconductor device in accordance with one or more embodiments, for example, as in the lithography and fabrication of an exemplary semiconductor device such as SRAM device 100 of FIG. 1, and SRAM device 600 of FIGS. 6A-6D. As with all methodologies discussed herein, although the methodologies 700 and 800 are illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

The methodology 700, for example, begins at 702, wherein gate and active layers are initially formed or otherwise provided at 710 in core and/or logic regions of a semiconductor device (e.g., SRAM device 100 of FIG. 1, and SRAM device 600 of FIGS. 6A-6D), for example, using lithographic tools comprising a scanner wherein the method will be carried-out. The semiconductor device (e.g., a memory cell of the SRAM) has a plurality of transistors having gate and active region features generally aligned along channel length (e.g., X) and channel width (e.g., Y) directions. For example, in FIGS. 3B, 4A-E, and FIGS. 6A-6D, the GATE regions 324 have the channel length dimension generally aligned along, for example, an X-direction, and the channel width dimension of the gate regions 324 generally aligned along, for example, a Y-direction. Similarly, the contacts CONT 322, ACTIVE/ MOAT regions 326 and isolation regions 329 are generally aligned along either the channel length direction (e.g., X-direction or axis) 330, or in the channel width direction (e.g., Y-direction or axis) 332.

Typically, the transistors may comprise NMOS and PMOS transistor each comprising source/drain regions formed in the ACTIVE/MOAT regions 326. The gates 324 of the transistors may comprise a polysilicon gate material that has been doped according to a desired work function to form an n-type polysilicon gate material and/or a p-type polysilicon gate material, the gates materials typically overlying a gate oxide (GOX).

At 720, method 700 comprises scanning (e.g., using scanner 300 of FIG. 3A) and aligning contact layer alignment and overlay marks (e.g., 521 of FIGS. 5B and 5C) associated with the contact layer 322 to gate layer alignment and overlay marks (e.g., 522 of FIGS. 5B and 5C) associated with a gate layer 324 to identify channel length direction (X) linear components (e.g., 523 of FIGS. 5B and 5C).

At 730, method 700 comprises scanning (e.g., using scanner 300 of FIG. 3A) and aligning contact layer alignment and overlay marks (e.g., 521 of FIGS. 5B and 5C) associated with the contact layer 322 to active layer alignment and overlay marks (e.g., 524 of FIGS. 5B and 5C) associated with the active layer 326 to identify channel width direction (Y) linear components (e.g., 525 of FIGS. 5B and 5C).

At 740 of method 700, the channel length direction (X) linear components (e.g., 523 of FIGS. 5B and 5C) of the gate layer alignment and overlay marks to control a lens (e.g., lens system 308 or 312 of FIG. 3A) of the scanner 300 for the correction and alignment of the contact layer 322 in the channel length direction (X) 330 of the semiconductor device (e.g., 600).

At 750 of method 700, the channel width direction (Y) linear components (e.g., 525 of FIGS. 5B and 5C) of the active layer alignment and overlay marks (e.g., 524 of FIGS. 5B and 5C) to control a stage (e.g., mask stage 310 or wafer stage 314 of FIG. 3A) of the scanner 300 for the correction and alignment of the contact layer 322 in the channel width direction (Y) 332 of the semiconductor device (e.g., 600).

Optionally at 760 of method 700 of FIG. 7, the contact layer 322 of the semiconductor device (e.g., 600) may be exposed, for example, for subsequent contact opening etching and contact metallization formation. Thereafter, the method ends at 780.

It will be appreciated that additional metallization, and/or other back-end processing can also be subsequently performed.

Accordingly, the method of the present embodiment optimizes overlay layer (e.g., contact overlay/layer) registration during lithography in the fabrication of an SRAM semiconductor device in both core/SRAM and logic regions and in the respective transistors of the same device, for example, SRAM device 100 or 600.

In FIG. 8, another exemplary methodology 800 is illustrated for optimizing contact layer registration (or another such mask/layer) during lithography of a semiconductor device in accordance with one or more embodiments, for example, as in the lithography and fabrication of an exemplary semiconductor device such as SRAM device 100 of FIG. 1, and SRAM device 600 of FIGS. 6A-6D.

The methodology 800, for example, begins at 802, wherein first and second layers are initially formed or otherwise provided at 810 in core and/or logic regions of a semiconductor device (e.g., SRAM device 100 of FIG. 1, and SRAM device 600 of FIGS. 6A-6D). The semiconductor device (e.g., a memory cell of the SRAM) has a plurality of transistors features generally aligned along first (e.g., X) and second (e.g., Y) directions. For example, in FIGS. 3B, 4A-E, and FIGS. 6A-6D, the GATE regions 324 have the channel length dimension generally aligned along, for example, an X-direction, and the channel width dimension of the gate regions 324 generally aligned along, for example, a Y-direction. Similarly, the contacts CONT 322, ACTIVE/MOAT regions 326 and isolation regions 329 are generally aligned along either the channel length direction (e.g., X-direction or axis) 330, or in the channel width direction (e.g., Y-direction or axis) 332.

Typically, the transistors may comprise NMOS and PMOS transistor each comprising source/drain regions formed in the ACTIVE/MOAT regions 326. The gates 324 of the transistors may comprise a polysilicon gate material that has been doped according to a desired work function to form an n-type polysilicon gate material and/or a p-type polysilicon gate material, the gates materials typically overlying a gate oxide (GOX).

At 840, method 800 comprises aligning the overlay layer (e.g., a contact layer, a dual-stress linear (DSL) layer, and a metal layer, 521 of FIGS. 5B and 5C) to a first layer (e.g., a gate layer, an active layer, an interlevel dielectric layer, and a metal layer) in the first direction (e.g., X-direction 330, or Y-direction 332, channel length or channel width direction) of the SRAM semiconductor device (e.g., SRAM device 100 of FIG. 1, and SRAM device 600 of FIGS. 6A-6D), using first layer alignment and overlay marks (e.g., 522 of FIGS. 5B and 5C) to control the alignment of the overlay layer in the first direction (e.g., X-direction 330, or Y-direction 332, channel length or channel width direction).

At 850, method 800 comprises aligning the overlay layer (e.g., a contact layer, a dual-stress linear (DSL) layer, and a metal layer, 521 of FIGS. 5B and 5C) to a second layer (e.g., a gate layer, an active layer, an interlevel dielectric layer, and a metal layer) in the second direction (e.g., X-direction 330, or Y-direction 332, channel length or channel width direction)

of the SRAM semiconductor device (e.g., SRAM device 100 of FIG. 1, and SRAM device 600 of FIGS. 6A-6D), using second layer alignment and overlay marks (e.g., 524 of FIGS. 5B and 5C) to control the alignment of the overlay layer in the second direction (e.g., X-direction 330, or Y-direction 332, channel length or channel width direction).

The first and second directions of method 800 may comprise one of a channel length (X) direction and a channel width (Y) direction.

Thereafter, the method ends at 880.

It will be appreciated that additional metallization, and/or other back-end processing can also be subsequently performed.

Accordingly, the method of the present embodiment optimizes overlay layer (e.g., contact overlay/layer) registration during lithography in the fabrication of an SRAM semiconductor device in both core/SRAM and logic regions and in the respective transistors of the same device, for example, SRAM device 100 or 600.

As a result of the improved alignment capabilities afforded by the dual-alignment methods, transistor feature sizes and spacings associated with contacts, gates and active regions, for example, may be reduced to facilitate device scaling and increased packing densities.

It will be appreciated that while reference is made throughout this document to exemplary structures in discussing aspects of methodologies described herein (e.g., those structures presented in FIGS. 3B, 4A-E, 5A-C and 6A-D while discussing the methodologies set forth in FIGS. 7-8, that those methodologies are not to be limited by the corresponding structures presented. Rather, the methodologies (and structures) are to be considered independent of one another and able to stand alone and be practiced without regard to any of the particular aspects depicted in the figures.

It is also to be appreciated that layers and/or elements depicted herein are illustrated with particular dimensions relative to one another (e.g., layer to layer dimensions and/or orientations) for purposes of simplicity and ease of understanding and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example. Further, the term "exemplary" as used herein merely meant to mean an example, rather than the best.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method for optimizing contact layer registration during lithography in the fabrication of a semiconductor device, the device having a plurality of transistors having active and gate region features extending generally along a channel length (X) direction and a channel width (Y) direction, respectively, the method comprising:
    aligning a contact layer to a gate layer in the channel length direction (X) of the semiconductor device during lithography of the contact layer; and
    aligning the contact layer to an active layer in the channel width direction (Y) of the semiconductor device during lithography of the contact layer.

2. The method of claim 1, wherein the
    aligning the contact layer to the gate layer in the channel length direction (X) of the semiconductor device, comprises using gate layer overlay marks associated with the gate layer to control the alignment of the contact layer in the channel length direction (X); and the
    aligning the contact layer to the active layer in the channel width direction (Y) of the semiconductor device, comprises using active layer overlay marks associated with the active layer to control the alignment of the contact layer in the channel width direction (Y) of the device.

3. The method of claim 1, wherein the
    aligning the contact layer to the gate layer in the channel length direction (X) of the semiconductor device, comprises using gate layer alignment and overlay marks associated with the gate layer to control the alignment of the contact layer in the channel length direction (X); and the
    aligning the contact layer to the active layer in the channel width direction (Y) of the semiconductor device, comprises using active layer alignment and overlay marks associated with the active layer to control the alignment of the contact layer in the channel width direction (Y) of the device.

4. The method of claim 1, further comprising
    forming gate and active layers in logic and SRAM regions of the semiconductor device before aligning the contact layer to the gate layer and aligning the contact layer to the active layer.

5. The method of claim 1, wherein the channel length (X) direction and the channel width (Y) direction are orthogonal.

6. The method of claim 1, wherein the
    aligning the contact layer to the gate layer in the channel length direction (X) of the semiconductor device, comprises scanning with a scanner and aligning contact layer overlay marks associated with the contact layer to gate layer overlay marks associated with the gate layer in order to control the alignment of the contact layer in the channel length direction (X); and the
    aligning the contact layer to the active layer in the channel width direction (Y) of the semiconductor device, comprises scanning with a scanner and aligning contact layer overlay marks associated with the contact layer to active layer overlay marks associated with the active layer in order to control the alignment of the contact layer in the channel width direction (Y) of the device.

7. The method of claim 1, wherein the
    aligning the contact layer to the gate layer in the channel length direction (X) of the semiconductor device, comprises scanning alignment marks associated with the gate layer with a scanner and aligning contact layer overlay marks associated with the contact layer to gate layer overlay marks associated with the gate layer in order to control the alignment of the contact layer in the channel length direction (X); and the aligning the contact layer to the active layer in the channel width direction (Y) of the semiconductor device, comprises scanning alignment marks associated with the active layer with a scanner and aligning contact layer overlay marks associated with the contact layer to active layer overlay marks associated with the active layer in order to control the alignment of the contact layer in the channel width direction (Y) of the device.

8. A method for optimizing overlay layer registration during lithography in the fabrication of an SRAM semiconductor device, the device having a plurality of transistor features extending generally along a first direction and a second direction, the method comprising:

aligning an overlay layer to a first layer in the first direction of the SRAM semiconductor device, using first layer overlay marks to control the alignment of the overlay layer in the first direction during lithography of the overlay layer; and aligning the overlay layer to a second layer different than the first layer in the second direction of the SRAM semiconductor device, using second layer overlay marks to control the alignment of the overlay layer in the second direction during lithography of the overlay layer.

9. The method of claim 8, wherein the overlay layer of the semiconductor device comprises one of a contact layer, a dual-stress linear (DSL) layer, and a metal layer.

10. The method of claim 8, wherein one of the first and second layers comprises one of a gate layer, an active layer, an interlevel dielectric layer, and a metal layer.

11. The method of claim 8, wherein one of the first direction and the second direction comprise one of a channel length direction and a channel width direction, respectively.

12. The method of claim 8, wherein one of the first direction and the second direction are orthogonal.

13. A method for optimizing overlay layer registration during lithography in the fabrication of an SRAM semiconductor device, the device having a plurality of transistor features extending generally along a first direction and a second direction, the method comprising:

aligning an overlay layer pattern illuminated from a mask onto a wafer to a first layer in the first direction of the SRAM semiconductor device, using first layer alignment and overlay marks to control the alignment of the overlay layer in the first direction; and aligning the overlay layer pattern illuminated from a mask onto a wafer to a second layer different than the first layer in the second direction of the SRAM semiconductor device, using second layer alignment and overlay marks to control the alignment of the overlay layer in the second direction.

14. A method for optimizing contact layer registration during lithography utilizing a scanner in the fabrication of a semiconductor device, the device having a plurality of transistors having active and gate region features extending generally along a channel length (X) direction and a channel width (Y) direction, respectively, the method comprising:

aligning contact layer overlay marks associated with a contact layer pattern illuminated from a mask onto a wafer to gate layer alignment and overlay marks associated with a gate layer on the wafer to identify channel length direction (X) linear components;

aligning contact layer overlay marks associated with the contact layer pattern illuminated from the mask onto the wafer to active layer alignment and overlay marks associated with the active layer on the wafer to identify channel width direction (Y) linear components;

using the channel length direction (X) linear components of the gate layer overlay marks to control a lens of the scanner for the correction and alignment of the contact layer pattern illuminated from the mask onto the wafer in the channel length direction (X) of the semiconductor device; and using the channel width direction (Y) linear components of the active layer overlay marks to control a stage of the scanner for the correction and alignment of the contact layer pattern illuminated from the mask onto the wafer in the channel width direction (Y) of the semiconductor device.

15. The method of claim 14, wherein the alignment marks are located within one or more die each comprising the semiconductor device, and the overlay marks are located within one or more scribe streets between two or more of the die.

16. The method of claim 14, further comprising forming gate and active layers in logic and SRAM regions of the semiconductor device before scanning the gate layer alignment and overlay marks associated with the gate layer and the active layer alignment and overlay marks associated with the active layer.

17. The method of claim 14, wherein the stage of the scanner controls one or more of a movement of a mask associated with the active layer, and a movement of one or more die each comprising the semiconductor device.

18. The method of claim 14, wherein the channel length (X) direction and the channel width (Y) direction are orthogonal with respect to each other.

19. A method for optimizing contact layer registration during lithography utilizing a scanner in the fabrication of a semiconductor device, the device having a plurality of transistors having active and gate region features extending generally along a channel length (X) direction and a channel width (Y) direction, respectively, the method comprising:

scanning alignment marks associated with a gate layer and aligning contact layer overlay marks associated with a contact layer to gate layer overlay marks associated with a gate layer to identify channel length direction (X) linear components during contact layer registration;

scanning alignment marks associated with an active layer and aligning contact layer overlay marks associated with the contact layer to active layer overlay marks associated with the active layer to identify channel width direction (Y) linear components during contact layer registration;

using the channel length direction (X) linear components of the gate layer overlay marks to control a lens of the scanner for the correction and alignment of the contact layer in the channel length direction (X) of the semiconductor device during contact layer registration; and using the channel width direction (Y) linear components of the active layer overlay marks to control a stage of the scanner for the correction and alignment of the contact layer in the channel width direction (Y) of the semiconductor device during contact layer registration.

* * * * *